US010727787B2

(12) United States Patent
Khoury (10) Patent No.: US 10,727,787 B2
(45) Date of Patent: Jul. 28, 2020

(54) FLOW DETECTION WITH QUADRATURE DEMODULATION

(71) Applicant: Silicon Laboratories Inc., Austin, TX (US)

(72) Inventor: John M. Khoury, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 421 days.

(21) Appl. No.: 15/705,961

(22) Filed: Sep. 15, 2017

(65) Prior Publication Data

US 2019/0089306 A1   Mar. 21, 2019

(51) Int. Cl.
G01F 1/66 (2006.01)
H03D 3/00 (2006.01)

(52) U.S. Cl.
CPC .............. *H03D 3/009* (2013.01); *G01F 1/66* (2013.01); *G01F 1/667* (2013.01); *H03D 3/007* (2013.01); *H03D 2200/0082* (2013.01)

(58) Field of Classification Search
CPC ........... H03D 3/009; H03D 2200/0082; H03D 3/007; G01F 1/66; G01F 1/667
See application file for complete search history.

(56) References Cited

U.S. PATENT DOCUMENTS 7,637,171 B2   12/2009  Zhang et al.

OTHER PUBLICATIONS

AMS, "Ultrasonic-Flow-Converter Data Sheet" TDC-GP30 System-Integrated Solution for Ultrasonic Flow Meters, vol. 1: General Data and Frontend Description, Jul. 31, 2015, 97 pages.
AMS, "Ultrasonic-Flow-Converter Data Sheet" TDC-GP22 Universal 2-Channel Time-to-Digital Converts, vol. 9, Mar. 13, 2014, 93 pages.
Hamouda, A., et al., "An Enhanced Technique for Ultrasonic Flow Metering Featuring Very Low Jitter and Offset," MDPI Sensors 2016, 12 pages.
Neptune Technology Group, Inc., "T-10 Meter Product Sheet," PS T10 Small, Jun. 2017, 4 pages.
Sierra Instruments, "Portable Ultrasonic Transit-Time Flow Meter," InovaSonic 210i B.1, Aug. 2013, 4 pages.
Texas Instruments, "TDC 1000 Ultrasonic Sensing Analog Front End (AFE) for Level Sensing, Flow Sensing, Concentration Sensing, and Proximity Sensing Applications," SNAS648B, Oct. 2014—revised Aug. 2015, 60 pages.
Texas Instruments, "TDC 7200 Time-to-Digital Converter for Time-of-Flight Applications in LIDAR, Magnetostrictive and Flow Meters," SNAS647D, Feb. 2015—revised Mar. 2016, 50 pages.

*Primary Examiner* — Xin Y Zhong
(74) *Attorney, Agent, or Firm* — Zagorin Cave LLP (57) ABSTRACT

A transmitter generates programmable upstream and downstream signal pulses for transmission through a fluid whose flow rate is being measured. A receiver receives the upstream and downstream signal pulses and stores digital representations of the pulses. A multiple pass algorithm such as a time domain windowing function and/or an algorithm that equalizes amplitude operates on the stored digital representations prior to demodulation. A quadrature demodulator generates in-phase and quadrature components of the digital representations and an arctangent function using the in-phase and quadrature components determines angles associated with the upstream and downstream signal pulses. The difference between the upstream and downstream angles, from which a difference in time of flight between the upstream and downstream signal pulses can be derived, is used to determine flow rate.

20 Claims, 5 Drawing Sheets

FLOW DETECTION WITH QUADRATURE DEMODULATION

BACKGROUND

Field of the Invention

This invention relates to flow sensors and more particularly to flow sensors that utilize quadrature demodulation in determining flow rate of a fluid flowing in a pipe.

Description of the Related Art

Ultrasonic fluid volume measurement utilizes the velocity of fluid flowing through a known conduit size. The fluid may be, e.g., water, or a gas, or another liquid. By transmitting ultrasonic pulses (typically around 1 MHz) upstream and downstream through the fluid, the fluid velocity can be measured by taking the difference of the time-of-flight (TOF) between the up and down stream paths since the downstream pulses transmitted in the direction of flow take less time than the upstream pulses transmitted against the flow. Many prior art solutions for TOF measurements rely on measuring the zero crossings of the received signal and compare the zero crossings of the received signals to the corresponding zero crossings of the signal on the TX side to obtain the TOF. The TOF measurements typically use a time to digital converter. The transmitter and the receiver sensors are piezo electric transducers that are placed at a known separation along the conduit (also referred to herein as a pipe). Once the fluid velocity is measured, and given the known diameter of the pipe, the volume of fluid flowing in the pipe can be determined.

Inaccuracies can arise in measurements using zero crossings and time to digital converters. Accordingly, improvements in flow meter sensing is desirable.

SUMMARY OF EMBODIMENTS OF THE INVENTION

Accordingly, in one embodiment a method of measuring flow rate includes generating an upstream signal to be transmitted through a fluid whose flow rate is being measured. The upstream signal is received and converted to a first upstream digital representation. The first upstream digital representation is stored as a stored first upstream digital representation. A downstream signal is generated for transmission through the fluid whose flow rate is being measured. The downstream signal is received, converted to a first downstream digital representation and stored as a stored first downstream digital representation. One or more multi-pass algorithms is performed on the stored first upstream digital representation and the stored first downstream digital representation to generate a processed first upstream digital representation and a processed first downstream digital representation. Quadrature demodulation of the processed first upstream digital representation is performed and an upstream angle associated therewith is determined. Quadrature demodulation of the processed first downstream digital representation is performed and a downstream angle associated therewith is determined. The flow rate is determined based in part on an angle difference between the upstream angle and the downstream angle.

In another embodiment, an apparatus includes a transmitter for generating an upstream signal and a downstream signal for transmission through a fluid whose flow rate is being measured. A receiver receives the upstream signal and the downstream signal. The receiver includes an analog to digital converter to convert the upstream signal to an upstream digital representation and to convert the downstream signal to a downstream digital representation. A quadrature demodulator is coupled to multiply the upstream signal, after conversion by the analog to digital converter, with an in-phase sinusoid and a quadrature sinusoid that are equal in frequency to the upstream signal to thereby generate in-phase and quadrature components associated with the upstream signal. The quadrature demodulator also multiplies the downstream digital signal after conversion by the analog to digital converter, with in-phase and quadrature sinusoids that are equal in frequency to the downstream signal to thereby generate in-phase and quadrature components associated with the downstream signal. An upstream angle is determined based on the in-phase and quadrature components associated with the upstream signal and a downstream angle is determined based on the in-phase and quadrature components associated with the downstream signal. A flow rate of the fluid is determined based in part on an angle difference between the upstream angle and the downstream angle and a reference clock signal.

In another embodiment, an apparatus includes a transmitter for generating an upstream signal and a downstream signal for transmission through a fluid whose flow rate is being measured. A receiver is configured to receive the upstream signal and the downstream signal, the receiver including a quadrature demodulator. The quadrature demodulator is configured to multiply an upstream digital representation of the upstream signal with in-phase and quadrature signals that are equal in frequency to the upstream signal to thereby generate in-phase and quadrature components associated with the upstream digital representation. The quadrature demodulator is further configured to multiply a downstream digital representation of the downstream signal with in-phase and quadrature signals that are equal in frequency to the downstream signal to generate in-phase and quadrature components of the downstream digital representation. An upstream angle with respect to a reference clock signal is determined based on the in-phase and quadrature components of the upstream digital representation and a downstream angle is determined with respect to the reference clock based on the in-phase and quadrature components of the downstream digital representation. The flow rate of the fluid is determined based in part on an angle difference between the upstream angle and the downstream angle and a period of the reference clock signal. $2\pi$ is added to the upstream angle responsive to the upstream angle being smaller than the downstream angle as part of determining the angle difference.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Rather than measure zero crossings, embodiments described herein measure the angle of the receive signal versus a reference clock. Measurement of the angle is based on an in-phase and quadrature correlation, followed by a CORDIC arctangent function. The arctangent function provides the angle of the received waveform versus the reference clock. An advantage of the correlator-based receiver is that the entire receive waveform is used to compute the angle (rather than a few zero crossings) and as such is less sensitive to noise and other signal distortions. Embodiments can be implemented using analog and digital and/or firmware implementations in a processor that allows customization for various applications, on-the-fly adaptation, and/or calibrations for various ultrasound sensors. Also, embodiments described herein do not require very high frequency clocks as does the TDC-based approach to achieve high accuracy. In embodiments utilizing a battery as a power source with a lifetime measured in years, e.g., consumer water meters, avoiding high frequency clocks can provide power savings over the 20 year lifetime of the battery.

Providing highly accurate flow meters can be a critical product advantage for flow meters. For example, measuring TOF differences to an accuracy of 5 psec-rms is desirable. Existing TDC-based methods are potentially more noise sensitive than the correlator-based method described herein. Certain of the embodiments described herein correlate the received signal with sinusoids. If other waveforms are desired, a different correlation signal (e.g., an explicit matched filter) can be used. The approach does not require high-speed clocks (e.g. >1 GHz required by a TDC) to obtain ~5 psec-rms resolution because the time of flight calculation does not require a TDC. If implemented using a microcontroller, the system can first store all of the receive samples in RAM and then use firmware to perform the correlation and calculate TOF. The correlations and calculations can be performed in an iterative way. That flexibility, especially with a microcontroller that can communicate wirelessly, allows for future upgrades. For example, if the piezo electric sensors change to a new type with different characteristics or undergo aging, the system can wirelessly reconfigure in the field to optimize an algorithm tuned to the new sensors.

Figure 1:
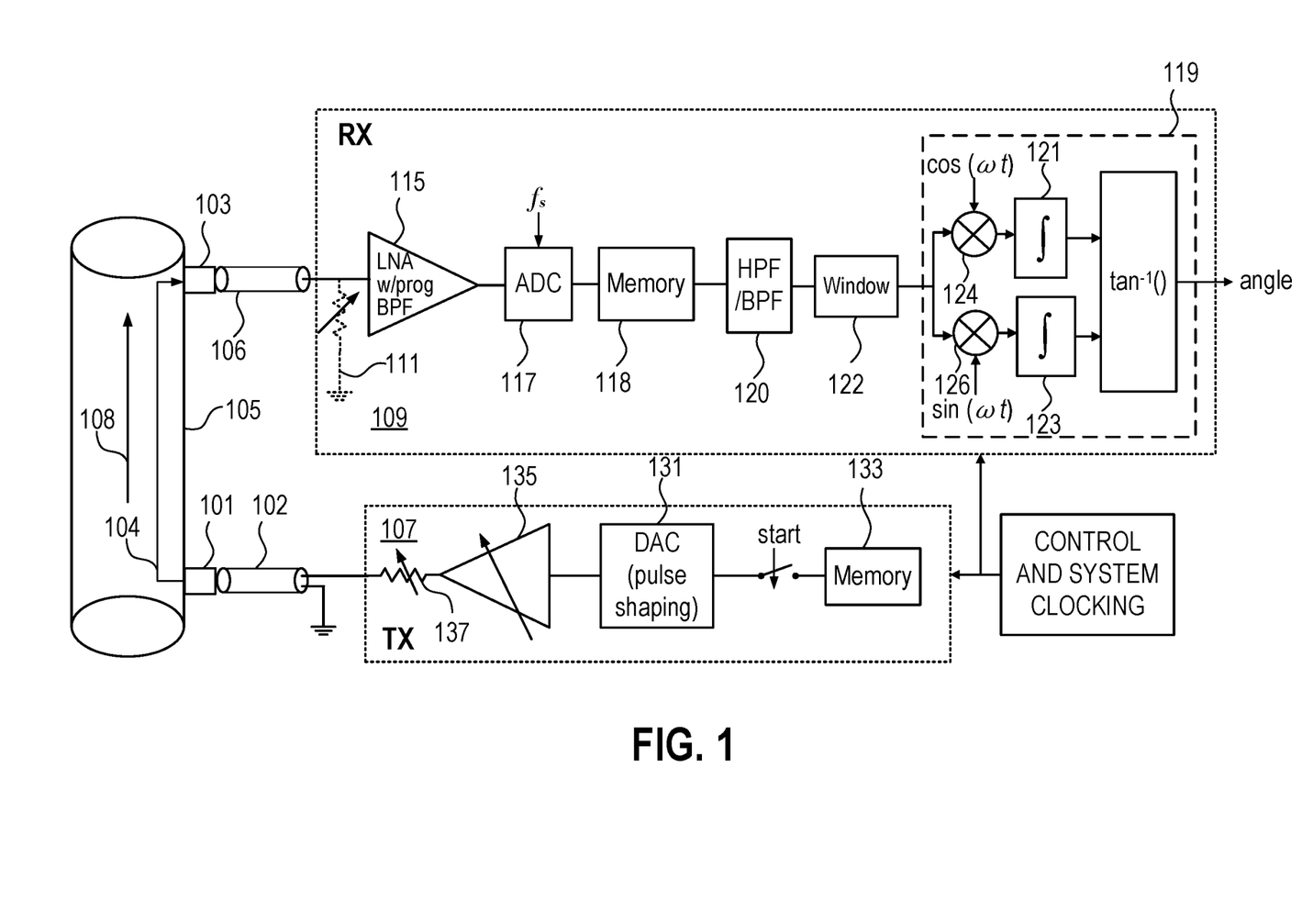
FIG. 1 illustrates a high level diagram of a flow rate measurement system utilizing quadrature demodulation.

FIG. 1 illustrates an embodiment of a system including a transmitter 107 and a receiver 109. The system includes piezo electric transducer 101 and a piezo electric transducer 103 both coupled to a pipe 105. The transducers supply an ultrasonic signal for transmission through the fluid and sense the ultrasonic signal transmitted through the fluid flowing in the pipe 105. The pipe may transport water, oil, a gas, or other kinds of fluids. The transmitter 107 sends a transmit signal to the piezo electric transducer 101 over a coaxial cable or other communication medium shown as transmission line 102. The piezo electric transducer 101 causes the signal 104 to travel through the fluid in pipe 105 and piezo electric sensor 103 receives the attenuated transmitted signal and supplies the received signal over coaxial cable (shown as a transmission line) 106 to receiver 109. The receiver 109 includes a variable termination resistance 111 that may provide the appropriate termination, e.g., 75Ω. A low noise amplifier 115, which may include a programmable band pass filter (BPF), supplies the signal to an analog to digital converter (ADC) 117, which samples the signal at a sample rate $f_s$. In an embodiment, the ADC is a 12 or 14 bit ADC with a sample rate of 38.4 MHz. The ADC stores the sampled data in a memory 118. A number of different types of filters may be used to process the sampled data before the data is supplied to the I/Q demodulator/correlator 119. For example, the filters may include high pass filters or band pass filters 120 to reject DC and improve the signal to noise ratio. A windowing function 122 may be used as described further herein. The receive pulses are correlated with sine and cosine signals having the same frequency as the frequency of the transmitted pulse. The sine and cosine functions may be stored in memory and in an embodiment have an amplitude resolution of 8 bits. The I and Q components supplied from multipliers 124 and 126 are supplied to integrate and dump filters 121 and 123 respectively and the angle of the receive signal is computed using the arctangent of the ratio of the I and Q components. The integrated and dump filters 121 and 123 integrate the multiplication results over a time period and then supply the integrated results for use in computing the angle. In an embodiment, the angle computation utilizes a CORDIC implementation of an arctan function of the ratio of the outputs from the integrate and dump filters 121 and 123. Note that while FIG. 1 shows the functionality described after ADC 117 as separate blocks, a preferred embodiment utilizes a microcontroller and performs the functions described digitally using firmware and/or software operating on the microcontroller. Other embodiments use dedicated digital hardware.

The system calculates the angle for at least one downstream signal and an angle for at least one upstream signal. Assuming the fluid in the pipe flows in the direction of arrow 108, for a downstream measurement, transmitter 107 supplies a transmit signal to piezo electric transducer 101, which imparts an ultrasonic signal to the liquid in pipe 105. Piezo electric transducer 103 senses the transmitted signal and supplies the sensed signal to the receiver 109. For upstream measurements, transmitter 107 supplies a transmit signal to piezo electric transducer 103, which causes an ultrasonic signal to flow through the liquid that is sensed by transducer 101, which supplies the sensed signal to the receiver logic 109. The transmit circuit 107 and the receive circuit 109 are coupled to appropriate ones of the transducers 101 and 103 by switches (not shown) for upstream and downstream measurements.

The transmitter 107 includes a pulse shaping digital to analog converter (DAC) 131 that converts the desired digital waveform supplied from memory 133 to analog pulses. The DAC 131 supplies an amplifier 135, which supplies coaxial cable 102 (or 106) with the transmit signal through an output impedance 137. In the illustrated embodiment, the gain of amplifier 135 and the output impedance 137 can both be varied.

Figure 2:
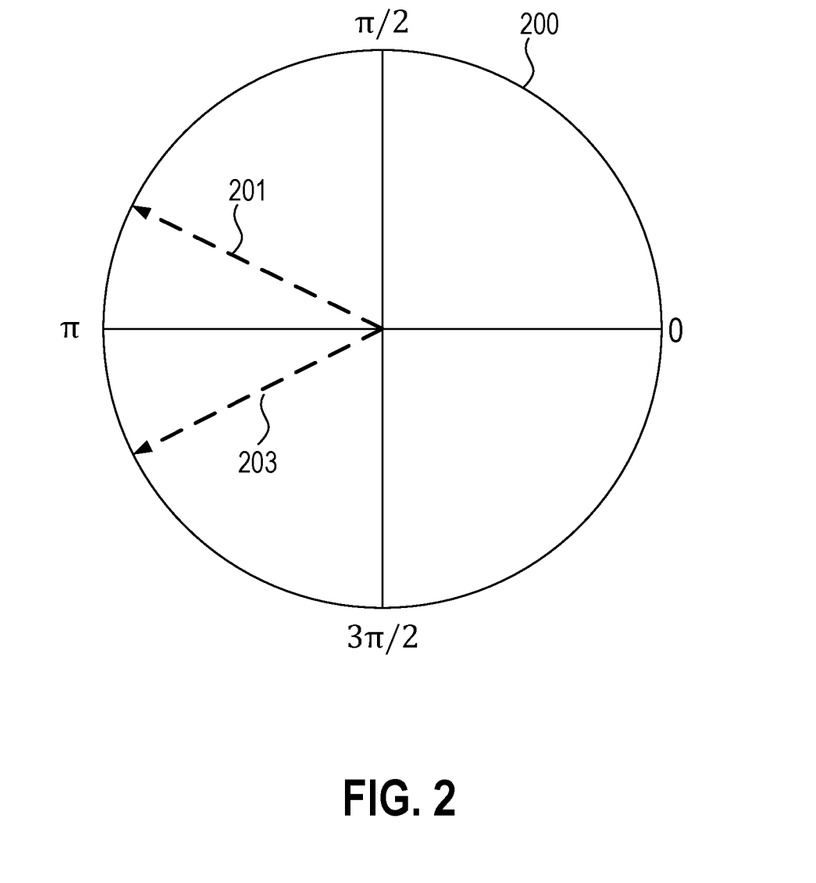
FIG. 2 illustrates angle measurements for upstream and downstream signals.

The difference between the upstream and downstream times of flight (ΔTOF) can be computed from the angle difference between the upstream and downstream angles and knowledge of the pulse frequency.

$$\Delta TOF = \frac{\theta_{up} - \theta_{dn}}{2\pi} T,$$

where T is the period of the carrier. FIG. 2 illustrates graphically an example of the angle measurements using unit circle 200. Assume 201 is the downstream angle $\theta_{dn}$ and 203 represents the upstream angle $\theta_{up}$. The downstream angle should be smaller than the upstream angle since the downstream signal is faster. By way of example, assuming the angle difference between the upstream and downstream angles is $\pi/4$ and the carrier is 1 MHz (period of 1 µs), $\Delta$TOF is 125 ns. If the upstream angle is smaller than the downstream angle, one embodiment adds $2\pi$ to the upstream angle. That assumes that the difference between the angles cannot be more than $2\pi$, or one period of the carrier. If the difference can be greater, then the ambiguity needs to be resolved another way. One such approach to resolve ambiguity is described later herein.

$\Delta$TOF can be used to determine the velocity of the fluid given the known separation of the sensors and the volumetric flow rate can be determined based on the cross sectional area of the pipe, the distance between the sensors, and the velocity of the fluid. The velocity of the fluid can be determined as follows:

$$TOF_{upstream} = \frac{L}{C_o - v} \text{ and } TOF_{downstream} = \frac{L}{C_o + v},$$

where, L is the separation between the transmitter and receiver, v is the velocity of the fluid, $C_o$ is the speed of sound in the fluid. In water the speed of sound is approximately 1500 m/s and varies with temperature.

$$\Delta TOF = TOF_{upstream} - TOF_{downstream}$$
$$\Delta TOF \approx \frac{2L}{C_o^2} v, \text{ resulting in } v \approx \frac{C_o^2}{2L} \Delta TOF$$

The volumetric flow rate in liters/second can be determined as Q=K×v×A, where K=pipe calibration factor depending on the sensor, v=velocity of the fluid in pipe, and A is the cross sectional area of the pipe. For example, for a pipe diameter of 3 cm, and the separation of the upstream and downstream piezo electric transducers is 15 cm, the pipe volume between the sensors is 0.106 L and a velocity of 1 m/s results in KA=0.71 liter/meter.

Figure 3A:
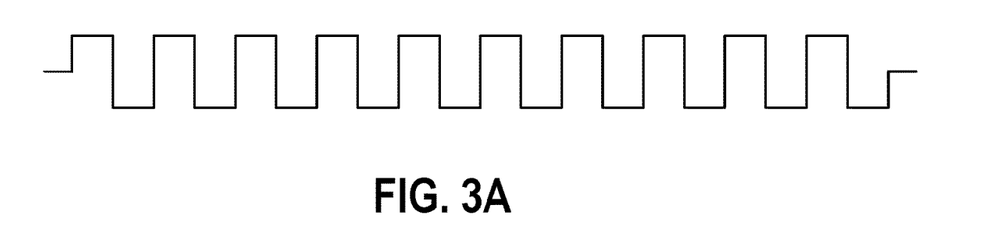
FIG. 3A illustrates a first example of a transmit signal as a rectangular wave.
Figure 3B:
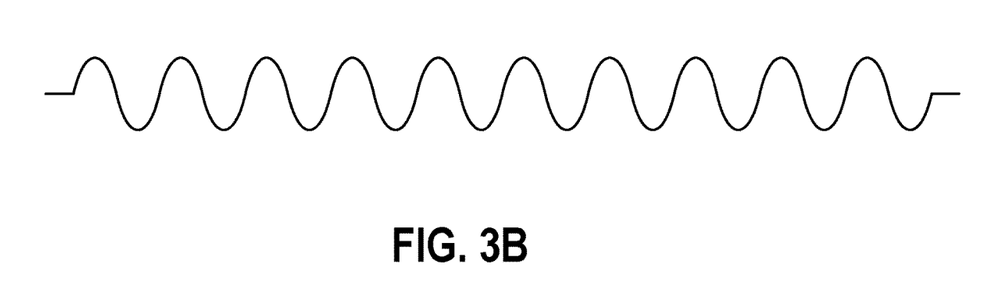
FIG. 3B illustrates a second example of a transmit signal as a sinusoid.
Figure 3C:
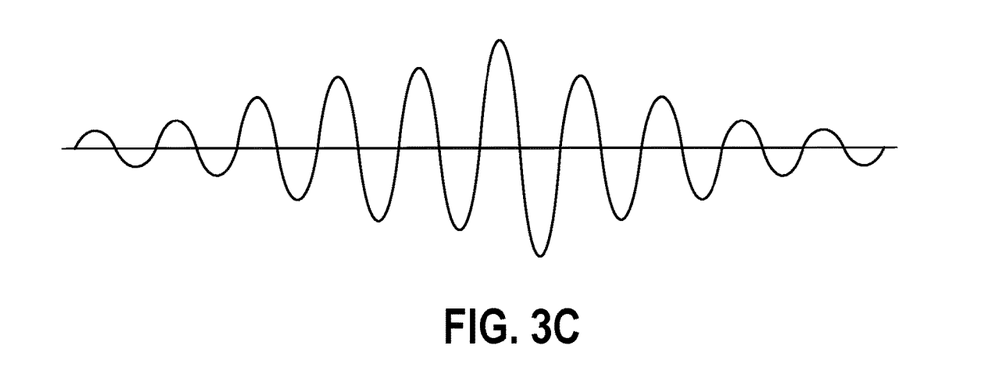
FIG. 3C illustrates a third example of a transmit signal as a shaped sinusoid.

Because the transmitter 107 stores waveforms digitally in memory 133 and uses DAC 131 to convert the digital representation to an analog representation, that allows the waveforms supplied to the piezo electric transducers to be programmable. FIGS. 3A-3C illustrate examples of waveforms that may be supplied by the DAC to amplifier 135 and subsequently to transducer 101 (or 103). FIG. 3A shows a 10 cycle rectangular pulse stream or burst. FIG. 3B shows a sinusoidal pulse stream or burst with ten cycles. FIG. 3C shows a shaped sinusoid having an amplitude that increases and then decreases. Embodiments may include linear increases and decreases in amplitude, exponential increases and decreases, or any suitable function.

Various aspects of the waveforms may be programmable. For example, in an embodiment the system can vary the exponential rise time constant and decay time constant controlling the exponential rise to a steady state amplitude and fall therefrom. The steady state amplitude can also be programmable. Using exponential rise and decay time constants avoids sudden starting and stopping that could lead to undesirable high frequency components causing errors in TOF determinations and thus errors in flow rate determinations. In addition, the number of cycles in the burst may be programmable. Further, the number of bursts may be programmable. For example, three bursts may be used for both upstream and downstream measurements with each angle determination using all three bursts. For example, the average of the angles for the three bursts can be used. Thus, a $\Delta$TOF measurement would be based on six measurements (three upstream and three downstream). Of course, the number of bursts can vary from one, as shown in FIGS. 3A-3C, to any suitable number for the particular application.

In addition, while shaped sinusoids may be used in some embodiments, in other embodiments, different wave forms may be used such as rectangular or triangular waveforms. In fact, the type of waveforms may be varied within the multiple bursts. For example, one waveform may use shaped sinusoids for one upstream burst and a rectangular wave for another upstream burst. Note that the downstream burst generally use the same types of bursts as the upstream.

The frequency of the waveforms can be varied to match the resonant frequency of the piezo electric transducers. Thus, e.g., while the resonant frequency of the transducer may be nominally 1 MHz, the actual frequency may vary and the frequency of the waveforms generated by the transmitter can be adjusted to match the center frequency of the particular transducer. The resonant frequency can be determined by transmitting waveforms of various frequencies around the nominal center frequency and evaluating which frequency of the various frequencies has the greatest amplitude. In an embodiment, the transmitter transmits a single step and the receiver would thus provide the step response from which the transducer resonant frequency and Q could be determined as well as the presence of any echoes.

The receiver (see 109 in FIG. 1) digitizes and stores the sampled received signals in memory allowing multi-pass algorithms to process the received data before performing the angle determinations and the $\Delta$TOF calculations. Multipass refers to an algorithm that accesses a data set multiple times, e.g., to evaluate the contents of a data set and then manipulate the contents. For example, where multiple bursts are used for each upstream and downstream measurements, a multi-pass algorithm may equalize the amplitude of the received waveforms for the upstream measurements, the downstream measurements, or both. Thus, the algorithm first evaluates the amplitudes of the bursts, determines an appropriate way to increase and/or decrease the amplitudes of particular bursts and then makes the adjustments to the data to equalize amplitudes. Equalizing amplitude can help improve the signal to noise ratio. In another example, a multi-pass algorithm may utilize a windowing function to window several received data patterns to the same time interval for subsequent demodulation. The time domain window excludes time intervals where no receive signals exists, other than system noise or undesired system echoes. The algorithm may look for echoes or evaluate amplitudes of the received waveforms to determine where to place the window function to capture the main lobes of the upstream and downstream signals and avoid noise and echoes.

Various type of window functions can be utilized. For example, in one embodiment a rectangular window may be used. However, a rectangular window at relatively low sample rates may unnecessarily exclude a portion of the received signal. In another embodiment, a smooth window function such as a Hanning window limits the exclusion of desired samples. In addition, to multi-pass algorithms, embodiments utilize high pass or band pass digital filters to reject excess out of band receive noise and DC offset.

Figure 4:
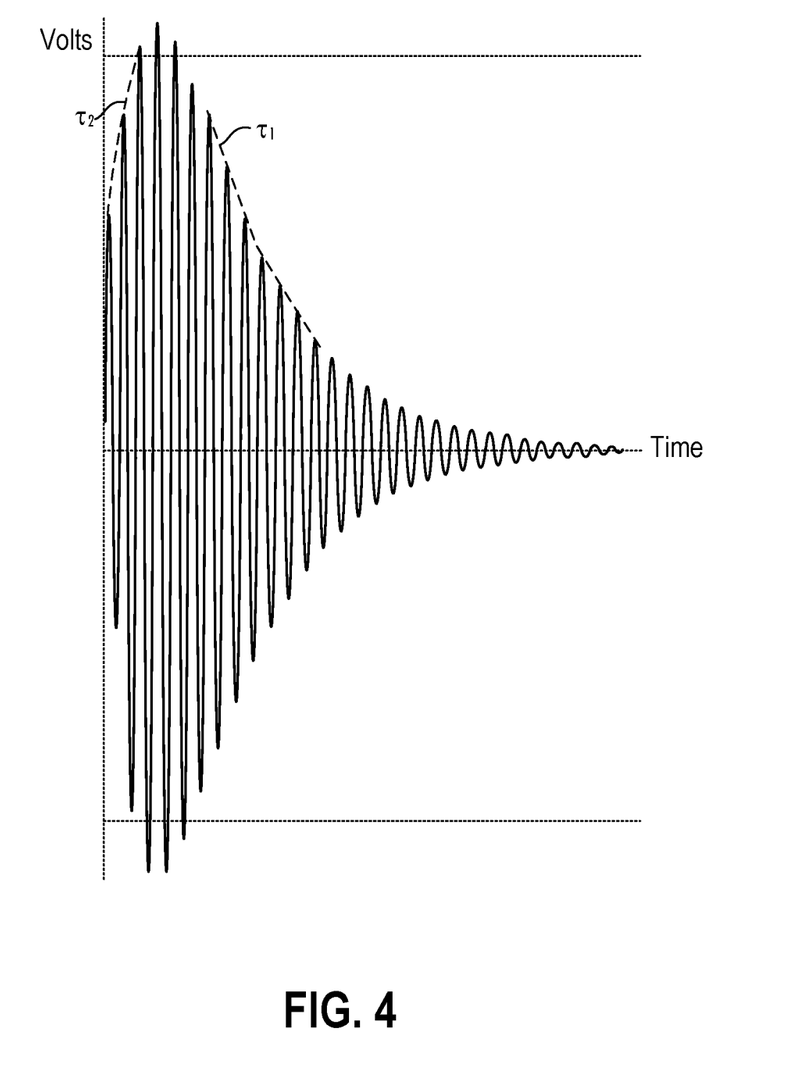
FIG. 4 illustrates an example of a receive signal.

Referring to FIG. 4, an exemplary model of a shaped sinusoidal receive signal is shown having an exponential rise time constant of τ2 and an exponential decay time constant of τ1. The received signal, $$r(t) = \cos(\omega_0 t)[1 - e^{-t/\tau_2}]e^{-t/\tau_1} \text{ or}$$

$$r(t) = \cos(\omega_0 t)[e^{-t/\tau_1} - e^{t/\tau_p}],$$

where $\tau_p = 1 \Big/ \left(\dfrac{1}{\tau_1} + \dfrac{1}{\tau_2}\right).$

The in-phase correlation, $$I = \int_0^\infty \cos(w_{LO} t + \theta) \cos(w_0 t)[e^{-t/\tau_1} - e^{-t/\tau_p}] dt$$

where the first cosine term is the demodulating clock signal (LO is local oscillator).

$$I = \frac{\tau_1}{2}\left[\frac{\cos\varnothing - \omega_s \tau_1 \sin\varnothing}{1+(\omega_s \tau_1)^2}\right] + \frac{\tau_1}{2}\left[\frac{\cos\varnothing - \omega_d \tau_1 \sin\varnothing}{1+(\omega_d \tau_1)^2}\right] - \frac{\tau_p}{2}\left[\frac{\cos\varnothing - \omega_s \tau_p \sin\varnothing}{1+(\omega_s \tau_p)^2}\right] - \frac{\tau_p}{2}\left[\frac{\cos\varnothing - \omega_d \tau_p \sin\varnothing}{1+(\omega_d \tau_p)^2}\right],$$

where $\omega_s = \omega_{LO} + \omega_0$ and $\omega_d = \omega_{LO} - \omega_0$ The quadrature correlation, $$Q = \int_0^\infty \sin(w_{LO} t + \theta) \cos(w_0 t)[e^{-t/\tau_1} - e^{-t/\tau_p}] dt$$

where the sine term is the demodulating clock signal.

$$Q = \frac{\tau_1}{2}\left[\frac{\cos\varnothing_q - \omega_s \tau_1 \sin\varnothing_q}{1+(\omega_s \tau_1)^2}\right] + \frac{\tau_1}{2}\left[\frac{\cos\varnothing_q - \omega_d \tau_1 \sin\varnothing_q}{1+(\omega_d \tau_1)^2}\right] - \frac{\tau_p}{2}\left[\frac{\cos\varnothing_q - \omega_s \tau_p \sin\varnothing_q}{1+(\omega_s \tau_p)^2}\right] - \frac{\tau_p}{2}\left[\frac{\cos\varnothing_q - \omega_d \tau_p \sin\varnothing_q}{1+(\omega_d \tau_p)^2}\right],$$

where $\varnothing_q = \varnothing - \dfrac{\pi}{2}$, $\omega_s = \omega_{LO} + \omega_0$, and $\omega_d = \omega_{LO} - \omega_0$.

Approximations with typical values are $$w_d \tau_1 << 1.0 \, w_d \approx 0$$

$$w_s \tau_1 >> 1.0 \, w_s \approx 2 w_{LO}$$

Those approximations lead to $$I = (\tfrac{1}{2})(\tau_1 - \tau_p)\cos\theta$$

$$Q = (\tfrac{1}{2})(\tau_1 - \tau_p)\sin\theta$$

The computed angle of the received signal $$\theta = \arctan\left[\frac{(1/2)(\tau_1 - \tau_p)\sin\varnothing}{(1/2)(\tau_1 - \tau_p)\cos\varnothing}\right] = \varnothing$$

The system computes the angles of the received signals for the one or more upstream pulse streams and for one or more downstream pulse streams. The difference in angles provides the basis for ΔTOF. As mentioned previously, if the upstream angle is smaller than the downstream angle, 2π can be added to the upstream angle. However, that assumes that the difference in the two angles is always less than 2π. If the angles could be farther apart, the ambiguity of the angles needs to be resolved. One way to resolve the ambiguity is to utilize a coarse measurement.

Figure 5:
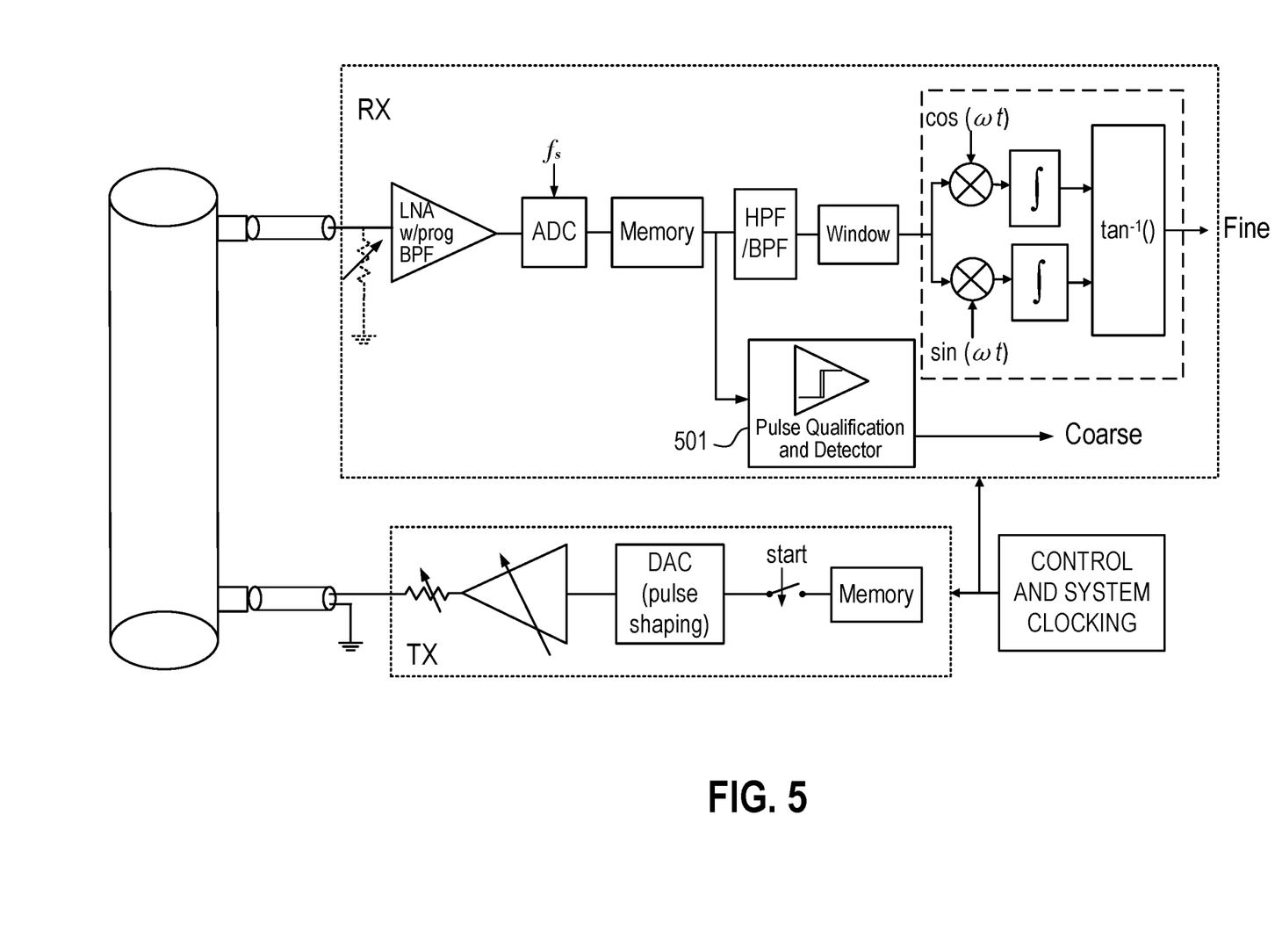
FIG. 5 illustrates a flow rate measurement system coarse measurement to resolve ambiguity in the angle measurements.

Referring to FIG. 5, an embodiment utilizes pulse qualification and a zero crossing detector 501 to qualify pulses and determine zero crossing of the received signal with respect to the transmit signal start time. The pulse qualification ensures that only pulses of a certain amplitude qualify for a zero crossing detection and the remaining lower amplitude signals are ignored. The coarse measurement utilizes firmware or a digital counter to covert the difference between zero crossing of the received waveform and the transmitted waveform to a TOF measurement but the measurement does not have high accuracy requirements. The coarse measurement provides a time difference between the upstream and downstream signals but only has to resolve the time difference between the upstream and downstream signals so the upstream angle and the downstream angle have the right number of radians added to them. For example, if the period of the reference clock is 1 μs for the angle measurement, the coarse measurement has to measure the difference in microseconds between the upstream angle and the downstream angle so the right number of radians can be added to the downstream and/or upstream angle measurements. There is no need to achieve an accuracy of 5 picoseconds for the coarse measurement. Once the ambiguity is resolved, the angle difference may be used to determine ΔTOF and the flow rate with high accuracy.

Thus, various aspects have been described relating to determining flow rates. The description of the invention set forth herein is illustrative, and is not intended to limit the scope of the invention as set forth in the following claims. Other variations and modifications of the embodiments disclosed herein, may be made based on the description set forth herein, without departing from the scope of the invention as set forth in the following claims.

What is claimed is:

1. A method of measuring flow rate comprising:
   generating an upstream signal for transmission through a fluid whose flow rate is being measured;
   receiving the upstream signal and converting the upstream signal to a first upstream digital representation and storing the first upstream digital representation as a stored first upstream digital representation;
   generating a downstream signal for transmission through the fluid whose flow rate is being measured;
   receiving the downstream signal and converting the downstream signal to a first downstream digital representation and storing the first downstream digital representation as a stored first downstream digital representation;
   performing one or more multi-pass algorithms on the stored first upstream digital representation and the stored first downstream digital representation and generating a processed first upstream digital representation and a processed first downstream digital representation;
   performing quadrature demodulation of the processed first upstream digital representation and determining an upstream angle associated therewith;
   performing quadrature demodulation of the processed first downstream digital representation and determining a downstream angle associated therewith; and
   determining the flow rate based in part on an angle difference between the upstream angle and the downstream angle.

2. The method as recited in claim 1 wherein the one or more multi-pass algorithms is at least one of a time domain window function and an amplitude equalization function.

3. The method as recited in claim 2 wherein performing the one or more multi-pass algorithms comprises:

determining the time domain window function based, at least in part, on the first stored upstream digital representation and one or more of the first stored downstream digital representation and a second stored upstream digital representation corresponding to a second upstream signal transmitted through the fluid.

4. The method as recited in claim 2 wherein performing the one or more multi-pass algorithms comprises:
equalizing amplitudes of the first stored upstream digital representation and one or more of the first stored downstream digital representation and a second stored upstream digital representation corresponding to a second upstream signal transmitted through the fluid.

5. The method as recited in claim 2 wherein the time domain window function is a smoothing window function.

6. The method as recited in claim 1 further comprising:
wherein the quadrature demodulation correlates the upstream and downstream signals with in-phase and quadrature sinusoids that are at a frequency of the upstream signal and the downstream signal.

7. The method as recited in claim 1 wherein the upstream signal is a programmable sinusoidal burst exponentially increasing and exponentially decaying to zero.

8. The method as recited in claim 1 further comprising programming a frequency of the upstream signal and the downstream signal to match a respective resonant frequencies of piezo-electric transducers coupled to a pipe in which the fluid flows.

9. The method as recited in claim 1 further comprising:
programming one or more of an amplitude of the upstream signal, a number of cycles in the upstream signal, and a pulse shape of the upstream signal.

10. The method as recited in claim 1 further comprising:
resolving ambiguity associated with a difference between the upstream angle and the downstream angle using a first coarse time of flight measurement of the upstream signal and a second coarse time of flight measurement of the downstream signal.

11. The method as recited in claim 1 further comprising:
if the upstream angle is smaller than the downstream angle, adding 2π to the upstream angle as part of determining the angle difference.

12. An apparatus comprising:
a transmitter for generating an upstream signal and a downstream signal for transmission through a fluid whose flow rate is being measured;
a receiver configured to receive the upstream signal and the downstream signal, the receiver including,
an analog to digital converter to convert the upstream signal to an upstream digital representation and to convert the downstream signal to a downstream digital representation;
a quadrature demodulator configured to multiply the upstream signal after conversion in the analog to digital converter with an in-phase sinusoid and a quadrature sinusoid that are equal in frequency to the upstream signal and to thereby generate in-phase and quadrature components associated with the upstream signal;
the quadrature demodulator being further configured to multiply the downstream signal after conversion in the analog to digital converter with in-phase and quadrature sinusoids that are equal in frequency to the downstream signal to thereby generate in-phase and quadrature components associated with the downstream signal;
wherein an upstream angle is determined based on the in-phase and quadrature components associated with the upstream signal and a downstream angle is determined based on the in-phase and quadrature components associated with the downstream signal; and
wherein the apparatus is configured to determine a flow rate of the fluid based in part on an angle difference between the upstream angle and the downstream angle.

13. The apparatus as recited in claim 12 further comprising:
at least one integrate and dump filter to integrate the one or more of the in-phase and quadrature components of the downstream digital representation and the one or more of the in-phase and quadrature components of the downstream digital representation and supply an integrated upstream in-phase value, an integrated upstream quadrature value, an integrated downstream in-phase value and an integrated downstream quadrature value; and
an arctangent function to determine the upstream angle based on the integrated upstream in-phase value and the integrated upstream quadrature value and to determine the downstream angle based on the integrated downstream in-phase value and the integrated downstream quadrature value.

14. The apparatus as recited in claim 12 wherein the receiver further comprises:
a smoothing time domain windowing filter to exclude digital samples in the upstream digital representation prior to demodulation, the smoothing time domain windowing filter based on the upstream digital representation and at least one of the downstream digital representation and a second upstream digital representation of a second upstream signal.

15. The apparatus as recited in claim 12 wherein the receiver further comprises:
an amplitude equalizing function to equalize amplitudes of the upstream digital representation and at least one of the downstream digital representation and a second upstream digital representation of a second upstream signal.

16. The apparatus as recited in claim 12 further comprising:
wherein a frequency of the downstream signal is programmed to match a resonant frequency of a piezo-electric transducer supplying the downstream signal to the fluid.

17. The apparatus as recited in claim 12 wherein the transmitter further comprises:
memory to store a digital representation of the downstream signal to be transmitted;
a digital to analog converter to convert the digital representation of the downstream signal to be transmitted to an analog representation; and
wherein an amplitude of the upstream signal, a number of cycles of the upstream signal, and a pulse shape of the upstream signal are programmable.

18. The apparatus as recited in claim 12 further comprising:
a zero crossing detector to provide respective coarse time of flight measurements for the upstream signal and the downstream signal; and
wherein ambiguity associated with a difference between the upstream angle and the downstream angle is resolved using the coarse time of flight measurements.

19. The apparatus as recited in claim 12 wherein responsive to the upstream angle being smaller than the downstream angle, 2 π is added to the upstream angle as part of determining the angle difference.

20. An apparatus comprising:
- a transmitter for generating an upstream signal and a downstream signal for transmission through a fluid whose flow rate is being measured;
- a receiver configured to receive the upstream signal and the downstream signal, the receiver including,
  - a quadrature demodulator configured to multiply an upstream digital representation of the upstream signal with in-phase and quadrature signals that are equal in frequency to the upstream signal to thereby generate in-phase and quadrature components associated with the upstream digital representation, the quadrature demodulator being further configured to multiply a downstream digital representation of the downstream signal with in-phase and quadrature signals that are equal in frequency to the downstream signal to generate in-phase and quadrature components of the downstream digital representation;
- wherein an upstream angle with respect to a reference clock signal is determined based on the in-phase and quadrature components of the upstream digital representation and a downstream angle is determined with respect to the reference clock signal based on the in-phase and quadrature components of the downstream digital representation;
- wherein the apparatus is configured to determine a flow rate of the fluid based in part on an angle difference between the upstream angle and the downstream angle and a period of the reference clock signal; and
- wherein 2π is added to the upstream angle responsive to the upstream angle being smaller than the downstream angle as part of determining the angle difference.

* * * * *